US006885233B2

(12) United States Patent
Huard et al.

(10) Patent No.: US 6,885,233 B2

(45) Date of Patent: Apr. 26, 2005

(54) ALTERING OPERATING FREQUENCY AND VOLTAGE SET POINT OF A CIRCUIT IN RESPONSE TO THE OPERATING TEMPERATURE AND INSTANTANEOUS OPERATING VOLTAGE OF THE CIRCUIT

(75) Inventors: Douglas Robert Huard, Portland, OR (US); Edward Allyn Burton, Hillsboro, OR (US); Keng L. Wong, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 20 days.

(21) Appl. No.: 10/138,345

(22) Filed: May 2, 2002

(65) Prior Publication Data

US 2003/0206050 A1 Nov. 6, 2003

(51) Int. Cl.[7] ........................................ H01L 35/00

(52) U.S. Cl. ........................................ 327/513; 327/540

(58) Field of Search ........................................ 327/291, 512, 327/513, 540, 541

(56) References Cited

U.S. PATENT DOCUMENTS

| | | | | |
|---|---|---|---|---|
| 4,769,809 A | | 9/1988 | Krick | |
| 4,855,690 A | | 8/1989 | Dias | |
| 5,239,274 A | | 8/1993 | Chi | 331/57 |
| 5,272,453 A | | 12/1993 | Traynor et al. | |
| 5,384,551 A | | 1/1995 | Kennedy et al. | 331/17 |
| 5,420,544 A | | 5/1995 | Ishibashi | 331/11 |
| 5,430,397 A | | 7/1995 | Itoh et al. | |
| 5,481,573 A | | 1/1996 | Jacobowitz et al. | |
| 5,490,059 A | * | 2/1996 | Mahalingaiah et al. | 700/46 |
| 5,565,816 A | | 10/1996 | Coteus | 331/2 |
| 5,625,805 A | | 4/1997 | Fenwick et al. | |
| 5,642,058 A | | 6/1997 | Trimberger et al. | 326/41 |
| 5,642,388 A | | 6/1997 | Evoy | |
| 5,723,998 A | * | 3/1998 | Saito et al. | 327/513 |
| 5,751,194 A | | 5/1998 | Haapanen et al. | 331/17 |
| 5,796,992 A | | 8/1998 | Reif et al. | |
| 5,838,179 A | | 11/1998 | Schmidt | 327/156 |
| 5,912,574 A | | 6/1999 | Bhagwan | 327/157 |
| 5,940,786 A | | 8/1999 | Steeby | |
| 5,949,262 A | | 9/1999 | Dreps et al. | |
| 5,999,025 A | | 12/1999 | New | 327/156 |
| 6,043,718 A | | 3/2000 | Diniz et al. | 331/57 |
| 6,078,634 A | | 6/2000 | Bosshart | 375/376 |
| 6,104,253 A | | 8/2000 | Hall et al. | |
| 6,140,883 A | | 10/2000 | Thomas | |
| 6,163,224 A | | 12/2000 | Araki et al. | 331/34 |
| 6,188,252 B1 | | 2/2001 | Kawakami | 327/101 |
| 6,201,448 B1 | | 3/2001 | Tam et al. | |
| 6,208,169 B1 | | 3/2001 | Wong et al. | |
| 6,268,749 B1 | | 7/2001 | Fisch et al. | |
| 6,298,450 B1 | | 10/2001 | Liu et al. | |
| 6,310,792 B1 | | 10/2001 | Drobnik | |
| 6,363,490 B1 | * | 3/2002 | Senyk | 713/300 |
| 6,366,154 B1 | | 4/2002 | Pulvirenti | 327/525 |
| 6,396,323 B1 | | 5/2002 | Mizuno | |
| 6,484,265 B1 | * | 11/2002 | Borkar et al. | 713/324 |

OTHER PUBLICATIONS

Moon, et al. "A New GHZ Cellular Oscillator Network", 4 pages, Copyright 1998 IEEE. 0–7803–4455–3/98.

* cited by examiner

*Primary Examiner*—Jeffrey Zweizig

(74) *Attorney, Agent, or Firm*—Kenyon & Kenyon

(57) ABSTRACT

Setting the clock frequency provided to a load circuit as function of the operating temperature and supply voltage of the load circuit, and setting the supply voltage as a function of the operating temperature of the load circuit. The load circuit can be safely operated above the frequency which would be the limit if the load circuit were operating at the maximum test temperature. At the given operating temperature, the supply voltage can be raised to permit even higher frequency operation, or lowered to reduce power.

41 Claims, 3 Drawing Sheets

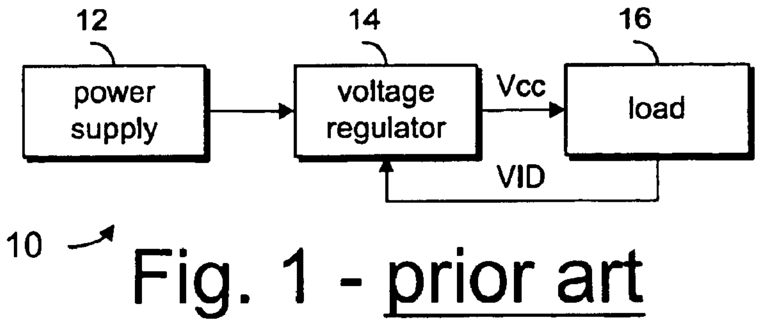
Fig. 1 - prior art
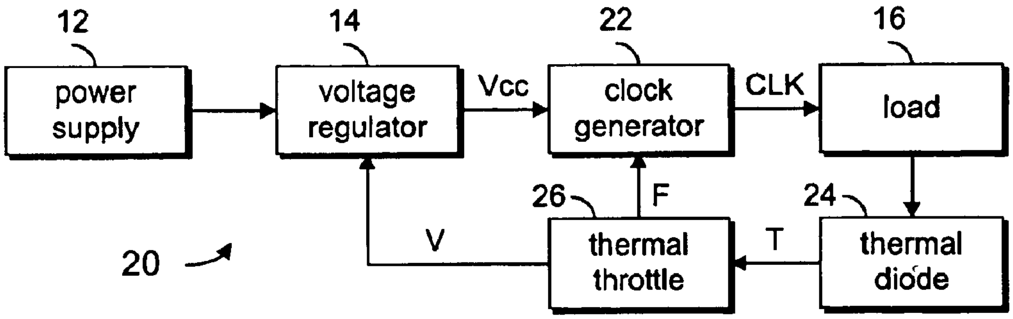
Fig. 2 - prior art
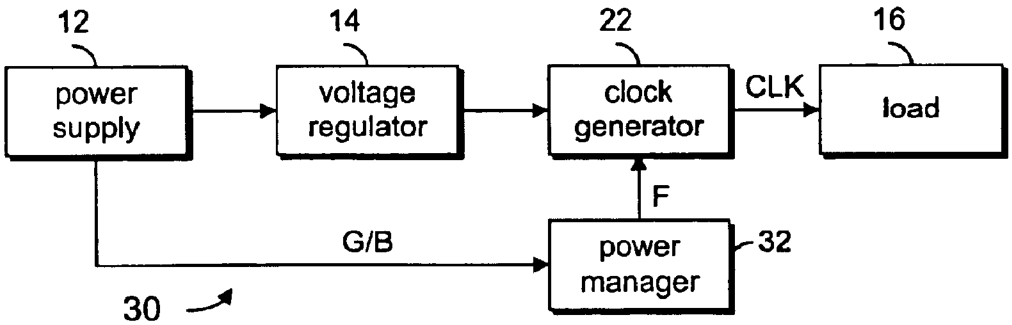
Fig. 3 - prior art

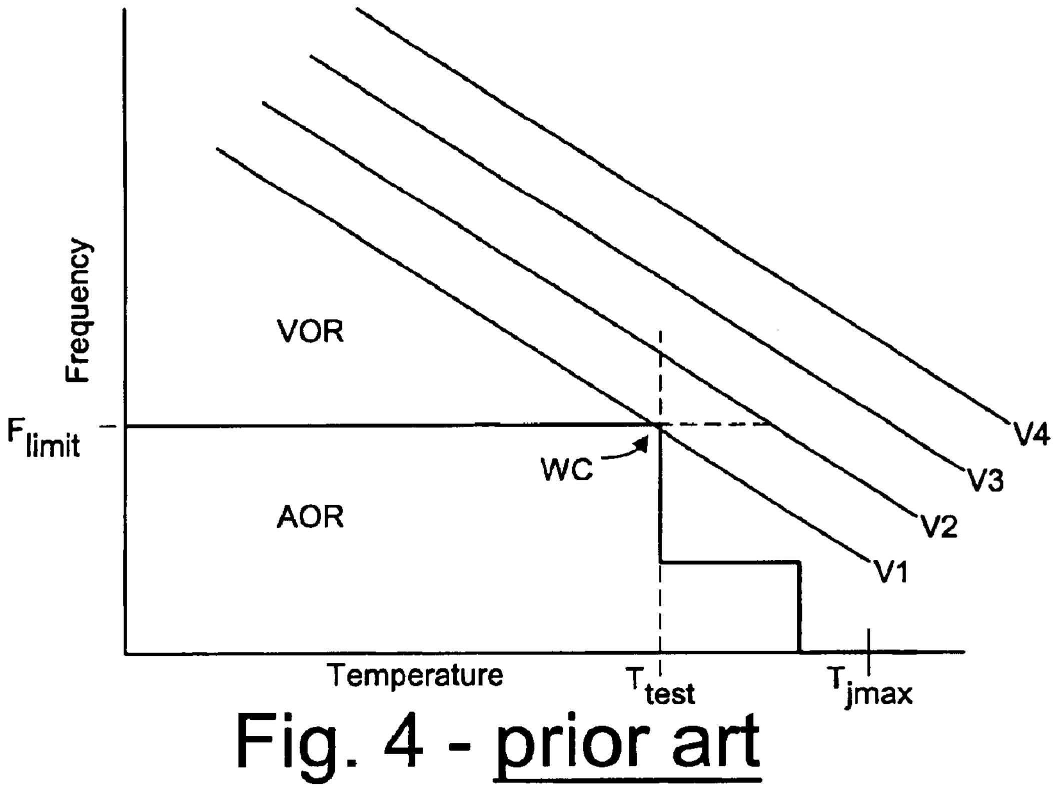
Fig. 4 - prior art
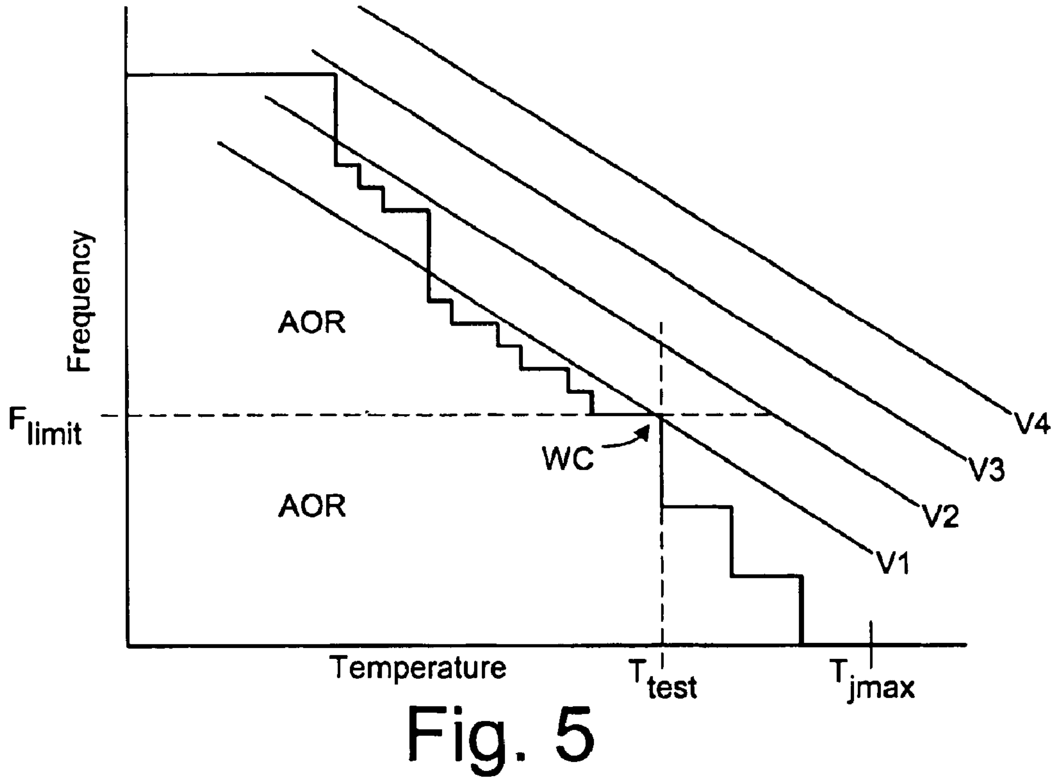
Fig. 5

60

ALTERING OPERATING FREQUENCY AND VOLTAGE SET POINT OF A CIRCUIT IN RESPONSE TO THE OPERATING TEMPERATURE AND INSTANTANEOUS OPERATING VOLTAGE OF THE CIRCUIT

This application is related to application Ser. No. 10/136,390 titled CLOCK GENERATING CIRCUIT AND METHOD, filed May 2, 2002; application Ser. No. 10/136,318 titled VOLTAGE CONTROL FOR CLOCK GENERATING METHOD, filed May 2, 2002; application Ser. No 10/136,474 titled FREQUENCY CONTROL FOR CLOCK GENERATING CIRCUIT, filed May 2, 2002; and application Ser. No. 10/136,321 titled VOLTAGE ID BASED FREQUENCY CONTROL FOR CLOCK GENERATING CIRCUIT, filed May 2, 2002.

BACKGROUND OF THE INVENTION

1. Technical Field of the Invention

This invention relates generally to controlling operating conditions such as clock frequency and supply voltage set point of a circuit, and more specifically to doing so as a function of the operating temperature and instantaneous voltage of the circuit.

2. Background Art

FIG. 1 illustrates a prior art system 10 in which a power supply 12 provides electricity to a voltage regulator 14, which in turn provides an operating voltage Vcc to a load circuit 16. The load circuit (or some other entity, not shown) provides a voltage identification control signal VID to the voltage regulator to tell the voltage regulator what operating voltage it should output to the load circuit. Regardless of the requested voltage specified by the voltage identification control signal, the actual instantaneous voltage seen at the load will typically vary over time, as the current consumed varies depending upon what the load is doing at the moment. This is due, in part, to changes in voltage drop seen across resistance in the line between the voltage regulator and the load.

FIG. 2 illustrates a prior art system 20 in which a power supply 12 provides electricity to a voltage supply which provides an operating voltage Vcc to a clock generator 22 (and to other elements of the system including the load). In some cases, the clock generator can be part of the load circuit. The clock generator provides a clock signal CLK to the load circuit 16. A thermal diode 24 or other suitable device determines the operating temperature of the load circuit, and provides a temperature signal T to a thermal throttling mechanism 26. According to the prior art, if the load circuit is too hot, the thermal throttling mechanism sends a frequency control signal F to the clock generator, causing the clock generator to generate a lower-frequency clock signal. At this lower frequency, the load circuit will operate at a lower temperature. Once the load circuit is cool enough, the thermal throttling mechanism can alter the frequency control signal to enable the clock generator to raise the clock frequency, improving performance of the load circuit. According to the more recent prior art, the thermal throttling mechanism also sends a signal (such as a VID signal) to the voltage regulator, to alter the operating voltage of the load.

FIG. 3 illustrates a prior art system 30 in which the power supply 12 provides power to the voltage regulator 14 which powers a clock generator 22 (and other elements including the load circuit), which in turn provides the clock signal CLK to the load circuit 16. The clock generator can, in some embodiments, be constructed as part of the load circuit. A power manager 32 receives a power supply signal G/B from the power supply indicating whether the system is running on grid power (G) or on battery power (B). In response to the state of the power supply signal, the power manager sends a frequency control signal F to the clock generator. When the system is running on grid power, the clock generator will generate a high-frequency clock signal to maximize performance of the load circuit. When the system is running on battery power, the clock generator will generate a low-frequency clock signal to minimize power consumption of the load circuit.

FIG. 4 illustrates frequency selection as is commonly practiced. In general, the lower the actual temperature of the chip, the faster it can be clocked. In general, higher operating voltages will enable faster clocking. In the example shown, the chip can receive any of four different voltage levels, from a low of V1 to a high of V4. The chip can be subjected to a range of temperatures below a maximum temperature (Tjmax) at which the device ceases to operate correctly or may even suffer permanent damage. The maximum operating temperature is generally specified at some lower temperature Ttest, to provide a safety margin against such occurrences. In selecting a maximum specified operating frequency Flimit for the chip, the manufacturer typically will simply use the worst corner case (WC) of Ttest and V1, which combination dictates the Flimit frequency.

At any temperature below Ttest, the chip will be operated at Flimit. If the temperature manages to climb above Ttest, the thermal throttling mechanism will cut the frequency to reduce the power consumption of the chip, and thereby reduce the temperature of the chip. The thermal throttling mechanism drives the frequency to zero before Tjmax is reached, to prevent catastrophic failure of the chip. In the more recent technologies, the thermal throttling mechanism may also be reducing the voltage in order to reduce power consumption, and may ultimately take the voltage to zero as the temperature approaches Tjmax.

It can be seen that the prior art operates the chip in what may be termed an "actual operating range" (AOR) which is the area under the heavy frequency line, and that the prior art does not take advantage of the additional "valid operating range" (VOR) which lies above that line and below a respective supply voltage line V1–V4. Typically, the part will be operated on the heavy frequency line. Thus, because the prior art has limited the operating frequency based upon a worst corner case assumption about voltage and temperature, and because these conditions will not typically be present (individually, much less in combination), the prior art leaves a great deal of available performance on the table.

What is needed, then, is an improvement in the art which allows the chip to operate in this valid operating range when operating conditions permit.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

FIG. 1 shows a voltage regulation system according to the prior art in which a voltage identification signal controls a voltage regulator.

FIG. 2 shows a thermal throttling system according to the prior art in which a thermal throttle controls a clock generator as a function of operating temperature.

FIG. 3 shows a power management system according to the prior art in which the clock signal differs according to whether the system is operating on grid power or on battery power.

FIG. 4 shows a frequency/temperature/voltage analysis and operation according to the prior art.

FIG. 5 shows a frequency/temperature/voltage analysis and operation according to this invention.

DETAILED DESCRIPTION

Figure 6:
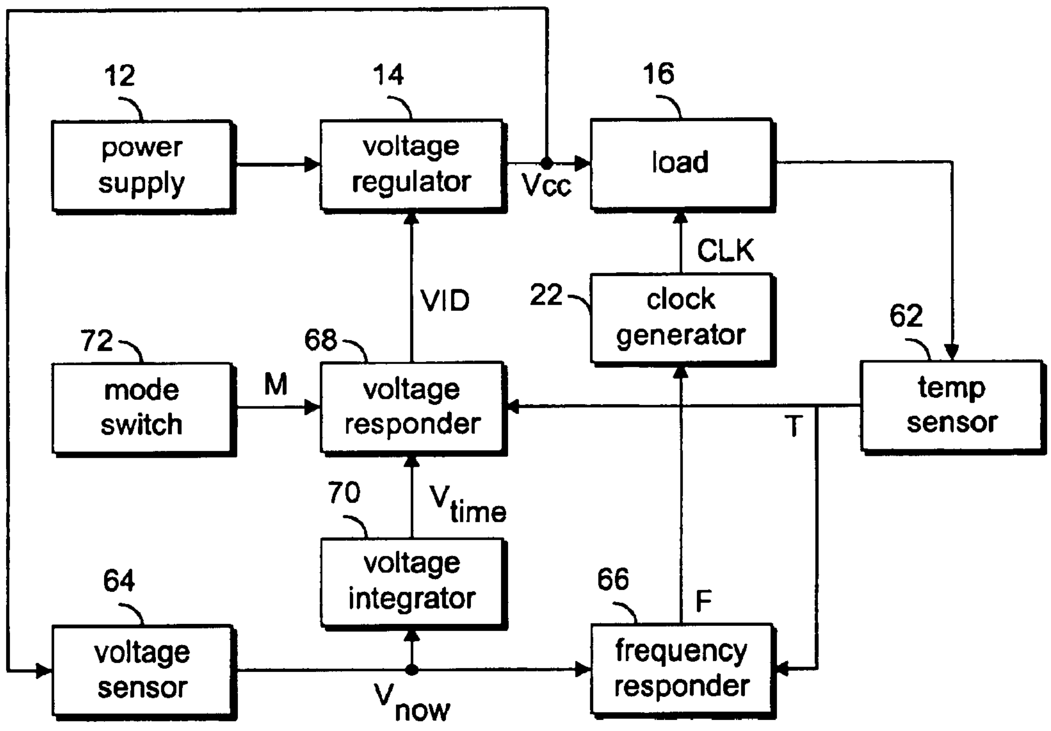
FIG. 6 shows one embodiment of a system according to this invention.

FIG. 5 illustrates one mode of operation of the invention. At the worst corner case of minimum voltage V1 and maximum temperature Ttest, the chip will be clocked at frequency Flimit, just as in the prior art. However, as the temperature falls below Ttest, the operating frequency is not fixed at Flimit, but can be raised, so long as it does not exceed the limit imposed by the voltage/temperature combination. This may be done in a series of steps, such as via a lookup table which uses temperature and voltage as addressing or index values and which outputs frequency values. In other embodiments, it may be done using an analog delay element which relies on the same physical properties as the load circuit.

The actual operating range (AOR) is extended to include the area above the Flimit frequency at which the prior art is limited. Under some circumstances, the system may elect to raise the operating voltage, such as from V1 to V2. This, in turn, will generally permit the frequency to be raised even further, as illustrated. At temperatures approaching Tjmax, the frequency and optionally also the voltage may be stepped downward to reduce power consumption, lower the temperature, and prevent data corruption or catastrophic failure.

The skilled reader will readily appreciate that the heavy frequency line shown is but one of countless possibilities. For example, it is not necessarily the case that as the temperature approaches Ttest, the voltage will be V1 nor even necessarily one of the lower voltages. The decisions about when and how much to alter the frequency and/or the voltage may be made in response to a wide variety of application demands, design constraints, and so forth.

FIG. 6 illustrates one exemplary embodiment of a system 60 according to this invention. A power supply 12 provides electrical power to a voltage regulator 14, which provides a voltage supply Vcc to a load circuit 16. The load circuit can be, for example, a microprocessor, or any other device in which it is appropriate for the invention to be practiced. The voltage regulator may typically be adapted to provide different voltages to different components in the system, but, for ease of illustration, only the Vcc voltage to the load circuit is illustrated here. A clock generator 22 provides a clock signal CLK to the load circuit.

A temperature sensor 62 measures the operating temperature of the load circuit and provides a signal T indicating the present temperature. A voltage sensor 64 is coupled to measure the Vcc voltage provided to the load circuit, and to provide a present voltage signal Vnow indicating the instantaneous present voltage. In some embodiments, the temperature sensor and the voltage sensor may be constructed as one unified module performing both functions.

A frequency responder 66 is coupled to receive the outputs Vnow and T of the voltage sensor and the temperature sensor, respectively, and, in response to them, provides a frequency control signal F to the clock generator to control the frequency of the clock signal CLK. As long as the load circuit is cool enough (e.g. below Ttest), the clock frequency can be raised above Flimit. The cooler the circuit is, the faster it can be clocked. At some point, the increased frequency will raise the temperature enough that the frequency must be lowered.

The system also includes a voltage responder 68 which provides a voltage identification signal VID to tell the voltage regulator what Vcc voltage it should provide to the load circuit. The voltage responder does this as a function of the temperature signal T from the temperature sensor, and as a function of the instantaneous voltage Vnow. In some embodiments, it may be found desirable to operate the voltage responder according to a voltage identification Vtime which has been smoothed over time, rather than according to the instantaneous voltage Vnow itself; in such cases, a voltage integrator 70 may be included to provide this smoothing function. The smoothing allows the voltage responder to make VID changes that make better sense in the long term, rather than simply responding to a possibly wildly swinging Vnow value.

An optional mode switch 72 provides a mode signal M to control the voltage responder, such that the system operates in either a high-performance mode or a low-power mode. If the mode switch has selected high-performance mode, the voltage responder will cause the operating voltage Vcc to be raised as high as reliability limits will allow, which will in turn enable the frequency responder to cause the clock signal CLK frequency to be raised.

In the low-power mode, the voltage responder will cause the operating voltage Vcc to be lowered as low as possible while still maintaining adequate performance, which will in turn force the frequency responder to lower the frequency, both of which will lower the temperature.

In one embodiment, the voltage sensor and the temperature sensor can include analog-to-digital (A/D) converters, which output multi-bit binary signals Vnow and T, respectively. In one embodiment, the voltage integrator and the voltage responder output multi-bit binary signals Vtime and VID, respectively. In one embodiment, the voltage responder and the frequency responder can be implemented as lookup tables stored in read-only memory, for example. In one embodiment, the clock generator can be a digital frequency divider. In one embodiment, the frequency output can be produced by an analog delay element which responds to voltage and temperature in the same way the load circuit does.

One scenario in which the invention may be advantageous is in applications in which the load circuit has large, sudden swings in the current it draws (di/dt), which cause voltage droop at the power supply. When the load circuit suddenly increases its current draw, the supply voltage Vcc may sag below the value indicated by VID, and the frequency responder lowers the frequency to keep the load circuit within reliable operating parameters. When the current draw lessens, or when the power supply catches up and provides the requested Vcc, the frequency responder reacts and increases the frequency to improve performance.

Using this invention can, in many instances, enable the load circuit and other components to be specified for use with a power supply or voltage regulator which is assumed to be somewhat better than the worst case power supply or voltage regulator; the invention will allow for the lower performance of the power supply or voltage regulator in those few cases where they are sub-par, while enabling the majority of the systems, in which the power supply or voltage regulator are performing well, to operate at a higher performance level.

Using this invention can, similarly, allow the usage of lower cost power supplies and voltage regulators, as those will no longer necessarily have to provide the same degree of droop prevention or transient performance that would be required without the invention.

As future load circuits trend toward larger current and lower voltage, this invention becomes even more desirable because the droop will become larger as a percentage of the total supply voltage.

The invention may prove useful in operating a wide variety of synchronous load circuits, that is, those which operate according to a clock frequency input. Some such clocked devices operate synchronously with respect to the other devices in their system, while others operate synchronously as to themselves but asynchronously with respect to other devices in their system.

The reader should appreciate that drawings showing methods, and the written descriptions thereof, should also be understood to illustrate machine-accessible media having recorded, encoded, or otherwise embodied therein instructions, functions, routines, control codes, firmware, software, or the like, which, when accessed, read, executed, loaded into, or otherwise utilized by a machine, will cause the machine to perform the illustrated methods. Such media may include, by way of illustration only and not limitation: magnetic, optical, magneto-optical, or other storage mechanisms, fixed or removable discs, drives, tapes, semiconductor memories, organic memories, CD-ROM, CD-R, CD-RW, DVD-ROM, DVD-R, DVD-RW, Zip, floppy, cassette, reel-to-reel, or the like. They may alternatively include down-the-wire, broadcast, or other delivery mechanisms such as Internet, local area network, wide area network, wireless, cellular, cable, laser, satellite, microwave, or other suitable carrier means, over which the instructions etc. may be delivered in the form of packets, serial data, parallel data, or other suitable format. The machine may include, by way of illustration only and not limitation: semiconductor fabrication factory, microprocessor, embedded controller, PLA, PAL, FPGA, ASIC, computer, smart card, networking equipment, or any other machine, apparatus, system, or the like which is adapted to perform functionality defined by such instructions or the like. Such drawings, written descriptions, and corresponding claims may variously be understood as representing the instructions etc. taken alone, the instructions etc. as organized in their particular packet/serial/parallel/etc. form, and/or the instructions etc. together with their storage or carrier media. The reader will further appreciate that such instructions etc. may be recorded or carried in compressed, encrypted, or otherwise encoded format without departing from the scope of this patent, even if the instructions etc. must be decrypted, decompressed, compiled, interpreted, or otherwise manipulated prior to their execution or other utilization by the machine.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Those skilled in the art having the benefit of this disclosure will appreciate that many other variations from the foregoing description and drawings may be made within the scope of the present invention. Indeed, the invention is not limited to the details described above. Rather, it is the following claims including any amendments thereto that define the scope of the invention.

What is claimed is:

1. An apparatus comprising:

a load circuit having a maximum operating temperature and having a maximum operating frequency dictated by the maximum operating temperature;

a clock generator coupled to provide a clock signal to the load circuit;

a temperature sensor coupled to detect an operating temperature of the load circuit;

a frequency responder comprising a lookup table coupled to the temperature sensor and to the clock generator to control a frequency of the clock signal to be above the maximum operating frequency if the temperature is below the maximum operating temperature.

2. The apparatus of claim 1 wherein the frequency responder is further to reduce the frequency of the clock signal as the temperature approaches the maximum operating temperature.

3. The apparatus of claim 1 wherein the lookup table is addressed by a digital value from the temperature sensor representing the temperature.

4. The apparatus of claim 3 wherein the lookup table is further addressed by a digital value representing a present operating voltage that is supplied to the load circuit.

5. The apparatus of claim 1 wherein the load circuit comprises a microprocessor.

6. An article of manufacture comprising:

a machine-accessible medium including data that, when accessed by a semiconductor fabrication factory, cause the semiconductor fabrication facility to construct the apparatus of claim 1.

7. An apparatus comprising:

a load circuit having a maximum operating temperature and having a maximum operating frequency dictated by the maximum operating temperature;

a clock generator coupled to provide a clock signal to the load circuit;

a temperature sensor coupled to detect an operating temperature of the load circuit;

a frequency responder coupled to the temperature sensor and to the clock generator to control a frequency of the clock signal to be above the maximum operating frequency if the temperature is below the maximum operating temperature, wherein the apparatus is adapted for use with a voltage regulator, the apparatus further comprising:

a voltage sensor coupled to detect a present operating voltage supplied to the load circuit;

a voltage responder coupled to the temperature sensor to provide a voltage identification control signal to the voltage regulator to tell the voltage regulator what operating voltage to provide to the load circuit, wherein the voltage identification control signal is generated in response to the detected operating temperature.

8. The apparatus of claim 7, wherein:

the voltage responder is further coupled to the voltage sensor and the voltage identification control signal is generated further in response to the present operating voltage.

9. An article of manufacture comprising:

a machine-accessible medium including data that, when accessed by a semiconductor fabrication factory, cause the semiconductor fabrication facility to construct the apparatus of claim 7.

10. The article of manufacture of claim 9 the machine-accessible medium comprises a recording medium bearing the data.

11. The article of manufacture of claim 9 the in machine-accessible medium comprises a carrier wave bearing the data.

12. An apparatus comprising:

a load circuit having a maximum operating temperature;

a clock generator coupled to the load circuit to provide a clock signal to the load circuit;

a unified sensor module including a voltage sensor coupled to detect an instantaneous operating voltage of the load circuit and a temperature sensor to detect an operating temperature of the load circuit; and a frequency responder coupled to the voltage sensor and to the clock generator to control a frequency of the clock signal according to the instantaneous operating voltages, the frequency responder further coupled to the temperature sensor to control the frequency of the clock signal according to the operating temperature.

13. The apparatus of claim 12 wherein the unified sensor module comprises an analog circuit.

14. The apparatus of claim 12 wherein the unified sensor module includes the frequency responder.

15. An apparatus comprising:

a voltage regulator to provide a supply voltage in response to a voltage identification control signal;

a load circuit coupled to receive the supply voltage;

a temperature sensor coupled to the load circuit to provide a temperature identification signal;

a voltage sensor coupled to provide a present voltage signal indicating a value of the supply voltage;

a frequency responder coupled to provide a frequency control signal as a function of the temperature identification signal and the present voltage signal;

a clock generator coupled to provide to the load circuit a clock signal whose frequency is indicated by the frequency control signal;

a voltage responder coupled to provide the voltage identification control signal as a function of the temperature identification signal and the present voltage signal.

16. The apparatus of claim 15 wherein the voltage responder is configured to implement a high performance mode of operation of the load circuit.

17. The apparatus of claim 15 wherein the voltage responder is configured to implement a low power mode of operation of the load circuit.

18. The apparatus of claim 15 further comprising:

a mode switch coupled to the voltage responder to select between a high-performance mode and a low-power mode.

19. The apparatus of claim 15 further comprising:

a thermal diode coupled between the load circuit and to the temperature sensor.

20. The apparatus of claim 15 further comprising:

a voltage integrator coupled between the voltage sensor and the voltage responder.

21. The apparatus of claim 15 further comprising:

the voltage regulator.

22. The apparatus of claim 15 wherein the frequency responder comprises a lookup table.

23. The apparatus of claim 22 wherein the frequency responder's lookup table is addressed by the temperature identification signal and the present voltage signal.

24. The apparatus of claim 15 wherein the voltage responder comprises a lookup table.

25. The apparatus of claim 24 further comprising:

a voltage integrator coupled between the voltage sensor and the voltage responder; and the voltage responder's lookup table is addressed by the temperature identification signal and an output of the voltage integrator.

26. An article of manufacture comprising:

a machine-accessible medium including data that, when accessed by a semiconductor fabrication factory, cause the semiconductor fabrication facility to construct the apparatus of claim 15.

27. An article of manufacture comprising:

a machine-accessible medium including data that, when accessed by a semiconductor fabrication factory, cause the semiconductor fabrication facility to construct the apparatus of claim 19.

28. The article of manufacture of claim 27 wherein the machine-accessible medium comprises a recording medium bearing the data.

29. The article of manufacture of claim 27 wherein the in machine-accessible medium comprises a carrier wave bearing the data.

30. An apparatus comprising:

a load circuit;

a voltage regulator for providing a supply voltage to the load circuit;

a clock generator for providing a clock signal to the load circuit, the clock signal having a clock frequency; and means, coupled to the voltage regulator and the clock generator, for selecting the supply voltage and the clock frequency as a function of an operating temperature of the load circuit and for selecting the clock frequency as a function of the supply voltage; and a mode switch coupled to the voltage responder for causing the voltage responder to selectably operate the load circuit in one of a high-performance mode and a low-power mode.

31. The apparatus of claim 30 wherein the load circuit comprises a microprocessor.

32. A method of operating a load circuit which is coupled to receive a supply voltage from a voltage regulator and a clock signal from a clock generator, the clock signal having a clock frequency, wherein the method comprises:

sensing the supply voltage;

sensing an operating temperature of the load circuit; and setting the clock frequency as a function of the sensed supply voltage and the sensed operating temperature by setting the clock frequency higher than would be possible for reliably correct operation of the load circuit at the test temperature if the operating temperature is below a test temperature.

33. The method of claim 32 wherein setting the clock frequency further comprises:

as the operating temperature approaches the test temperature, reducing the clock frequency to keep the clock frequency below a predetermined reliability threshold.

34. The method of claim 32 further comprising:

setting the operating voltage as a function of the operating temperature.

35. The method of claim 34 further comprising:

setting the operating voltage further as a function of a mode switch that selects between a high-performance mode and a low-power mode.

36. A method of operating a load circuit which is coupled to receive a supply voltage from a voltage regulator and a clock signal from a clock generator, the clock signal having a clock frequency, wherein the method comprises:

detecting a present operating temperature of the load circuit;

detecting the supply voltage;

setting the clock frequency as a function of the detected present operating temperature and the detected supply voltage;

setting the supply voltage as a function of the detected present operating temperature; and selecting a maximum frequency permitted by both the detected supply voltage and a reliability characteristic of the load circuit at the detected present operating temperature by looking up the maximum frequency in a lookup table.

37. The method of claim 36 further comprising:

using the detected present operating temperature and the detected supply voltage as addresses into the lookup table.

38. An article of manufacture comprising:

a machine-accessible medium including data that, when accessed by a semiconductor fabrication factory, cause the semiconductor fabrication facility to construct an apparatus comprising:

a load circuit;

a voltage regulator for providing a supply voltage to the load circuit;

a clock generator for providing a clock signal to the load circuit, the clock signal having a clock frequency; and means, coupled to the voltage regulator and the clock generator, for selecting the supply voltage and the clock frequency as a function of an operating temperature of the load circuit.

39. The article of manufacture of claim 38 wherein the machine-accessible medium further includes data that cause the semiconductor fabrication factory to construct the apparatus to further comprise:

wherein the means is further for selecting the clock frequency as a function of the supply voltage;

a mode switch coupled to the voltage regulator for causing the voltage regulator to selectably operate the load circuit in one of a high-performance mode and a low-power mode; and wherein the load circuit comprises a microprocessor.

40. The article of manufacture of claim 39 wherein the machine-accessible medium comprises a recording medium bearing the data.

41. The article of manufacture of claim 39 wherein the machine-accessible medium comprises a carrier wave bearing the data.

* * * * *

UNITED STATES PATENT AND TRADEMARK OFFICE

CERTIFICATE OF CORRECTION

PATENT NO. : 6,885,233 B2
DATED : April 26, 2005
INVENTOR(S) : Douglas R. Huard et al.

It is certified that error appears in the above-identified patent and that said Letters Patent is hereby corrected as shown below:

Column 6,
Lines 27 and 62, "fabrication factory" should be -- fabrication facility --.
Lines 49-50, take out the break in line 49.
Line 65, "of claim 9 the machine" should be -- of claim 9 wherein the machine --.

Column 7,
Line 1, "claim 9 the" should be -- claim 9 wherein the --.
Line 1, "the in machine" should be -- the machine --.

Column 9,
Line 21, "fabrication factory" should be -- fabrication facility --.

Column 10,
Line 9, "fabrication factory" should be -- fabrication facility --.

Signed and Sealed this

Twenty-fifth Day of October, 2005

JON W. DUDAS
*Director of the United States Patent and Trademark Office*